(12) United States Patent
Harper, Jr.

(10) Patent No.: US 6,994,565 B2
(45) Date of Patent: Feb. 7, 2006

(54) ELECTRICAL CONTACT ASSEMBLY WITH INSULATIVE CARRIER, STAPLED CONTACT ATTACHMENT AND FUSIBLE ELEMENT

(75) Inventor: Donald K. Harper, Jr., Camp Hill, PA (US)

(73) Assignee: FCI Americas Technology, Inc., Reno, NV (US)

( * ) Notice: Subject to any disclaimer, the term of this patent is extended or adjusted under 35 U.S.C. 154(b) by 359 days.

(21) Appl. No.: 10/619,647

(22) Filed: Jul. 14, 2003

(65) Prior Publication Data

US 2005/0014396 A1  Jan. 20, 2005

(51) Int. Cl.
*H01R 12/00* (2006.01)

(52) U.S. Cl. .......................................... 439/66; 439/83
(58) Field of Classification Search ................ 439/83, 439/81, 82, 71–73, 65, 66
See application file for complete search history.

(56) References Cited

U.S. PATENT DOCUMENTS

| | | | |
|---|---|---|---|
| 2,922,948 A | 1/1960 | Washburn | 324/29.5 |
| 3,107,319 A | 10/1963 | Vizzier, Sr. | 317/101 |
| 3,432,801 A | 3/1969 | Ruotolo | 339/126 |
| 3,654,592 A | 4/1972 | Primorac | 339/176 |
| 3,915,537 A | 10/1975 | Harris et al. | 339/64 |
| 3,951,495 A | 4/1976 | Donaher et al. | 339/17 |
| 4,199,209 A | 4/1980 | Cherian et al. | 339/59 |
| 4,307,928 A | 12/1981 | Petlock, Jr. | 339/254 |
| 4,315,663 A | 2/1982 | Olsson | 339/97 |
| 4,341,433 A | 7/1982 | Cherian et al. | 339/176 |
| 4,533,203 A | 8/1985 | Feldman et al. | 339/176 |
| 4,553,192 A | 11/1985 | Babuka et al. | 361/395 |
| 4,620,761 A | 11/1986 | Smith et al. | 339/75 |
| 4,647,126 A | 3/1987 | Sobota, Jr. | 339/17 |
| 4,699,593 A | 10/1987 | Grabbe et al. | 439/71 |
| 4,773,877 A | 9/1988 | Krüger et al. | 439/482 |
| 4,778,404 A | 10/1988 | Pass | 439/387 |
| 4,805,885 A | 2/1989 | Rose et al. | 267/165 |
| 4,830,623 A | 5/1989 | Owens et al. | 439/71 |
| 4,891,019 A | 1/1990 | Olsson | 439/404 |
| 4,906,194 A | 3/1990 | Grabbe | 439/71 |
| 4,927,369 A | 5/1990 | Grabbe et al. | 439/66 |
| 4,954,087 A | 9/1990 | Lauks et al. | 439/71 |
| 4,969,826 A | 11/1990 | Grabbe | 439/66 |
| 4,978,308 A | 12/1990 | Kaufman | 439/83 |
| 4,990,107 A | 2/1991 | Fortuna | 439/637 |
| 4,998,886 A | 3/1991 | Werner | 439/66 |
| 5,015,196 A | 5/1991 | Yamada | 439/326 |

(Continued)

FOREIGN PATENT DOCUMENTS

DE  3507464 A1  8/1984

(Continued)

*Primary Examiner*—Ross Gushi
(74) *Attorney, Agent, or Firm*—Harrington & Smith, LLP (57) ABSTRACT

An electrical contact assembly including a contact terminal and a fusible element. The contact terminal has a base and two cantilevered deflectable contact arms extending from at least one lateral side of the base. A first one of the contact arms extends in a downward direction and a second one of the contact arms extends in an upward direction. The fusible element is fixedly attached to an end of the first contact arm. The fusible element is adapted to be fused to a first pad on a first electronic component. The second contact arm comprises a surface contact area for contacting a second pad on a second electronic component. The first and second contact arms are adapted to deflect when the contact area of the second contact arm is contacted by the second pad of the second electronic component.

21 Claims, 4 Drawing Sheets

U.S. PATENT DOCUMENTS

| | | | |
|---|---|---|---|
| 5,055,054 A | 10/1991 | Doutrich | 439/66 |
| 5,061,192 A | 10/1991 | Chapin et al. | 439/66 |
| 5,137,456 A | 8/1992 | Desai et al. | 439/66 |
| RE34,084 E | 9/1992 | Noschese | 439/66 |
| 5,145,384 A | 9/1992 | Asakawa et al. | 439/78 |
| 5,152,695 A | 10/1992 | Grabbe et al. | 439/71 |
| 5,158,468 A | 10/1992 | Curtis et al. | 439/76 |
| 5,161,982 A | 11/1992 | Mowry | 439/68 |
| 5,167,512 A | 12/1992 | Walkup | 439/66 |
| 5,173,055 A | 12/1992 | Grabbe | 439/66 |
| 5,199,889 A | 4/1993 | McDevitt, Jr. | 439/66 |
| 5,228,861 A * | 7/1993 | Grabbe | 439/66 |
| 5,259,769 A | 11/1993 | Cruise et al. | 439/65 |
| 5,263,880 A | 11/1993 | Schwarz et al. | 439/733 |
| 5,308,252 A | 5/1994 | Mroczkowski et al. | 439/66 |
| 5,324,205 A | 6/1994 | Ahmad et al. | 439/66 |
| 5,337,202 A | 8/1994 | Jabbarai et al. | 360/97.01 |
| 5,342,205 A | 8/1994 | Hashiguchi | 439/66 |
| 5,357,386 A | 10/1994 | Haidari et al. | 360/97.02 |
| 5,358,411 A | 10/1994 | Mroczkowski et al. | 439/66 |
| 5,366,380 A | 11/1994 | Reymond | 439/66 |
| 5,378,160 A | 1/1995 | Yumibe et al. | 439/66 |
| 5,380,210 A | 1/1995 | Grabbe et al. | 439/66 |
| 5,437,556 A | 8/1995 | Bargain et al. | 439/66 |
| 5,462,440 A | 10/1995 | Rothenberger | 439/66 |
| 5,464,355 A | 11/1995 | Rothenberger | 439/559 |
| 5,476,211 A | 12/1995 | Khandros | 228/180.5 |
| 5,484,295 A | 1/1996 | Mowry et al. | 439/66 |
| 5,498,166 A | 3/1996 | Rothenberger | 439/66 |
| 5,573,435 A | 11/1996 | Grabbe et al. | 439/862 |
| 5,597,313 A | 1/1997 | Lindeman | 439/66 |
| 5,632,631 A | 5/1997 | Fjelstad et al. | 439/82 |
| 5,653,598 A | 8/1997 | Grabbe | 439/66 |
| 5,746,626 A | 5/1998 | Kwiat et al. | 439/630 |
| 5,772,449 A | 6/1998 | Feldmeier et al. | 439/66 |
| 5,772,451 A | 6/1998 | Dozier, II et al. | 439/70 |
| 5,800,184 A | 9/1998 | Lopergolo et al. | 439/66 |
| 5,810,609 A | 9/1998 | Faraci et al. | 439/71 |
| 5,812,378 A | 9/1998 | Fjelstad et al. | 361/769 |
| 5,860,831 A * | 1/1999 | Roder et al. | 439/422 |
| 5,913,687 A | 6/1999 | Rathburn | 439/66 |
| 5,938,451 A | 8/1999 | Rathburn | 439/66 |
| 5,967,797 A | 10/1999 | Maldonado | 439/66 |
| 5,984,693 A | 11/1999 | McHugh et al. | 439/66 |
| 5,996,267 A | 12/1999 | Breckenridge | 43/12 |
| 5,997,317 A | 12/1999 | Pei et al. | 439/83 |
| 6,019,611 A | 2/2000 | McHugh et al. | 439/71 |
| 6,042,412 A | 3/2000 | Murr | 439/331 |
| 6,079,988 A | 6/2000 | Hashiguchi et al. | 439/66 |
| 6,132,222 A | 10/2000 | Wang et al. | 439/70 |
| 6,155,845 A | 12/2000 | Lin et al. | 439/83 |
| 6,176,707 B1 | 1/2001 | Neidich et al. | 439/66 |
| 6,179,624 B1 | 1/2001 | McHugh et al. | 439/71 |
| 6,193,523 B1 | 2/2001 | Harper, Jr. | 439/66 |
| 6,203,331 B1 | 3/2001 | McHugh et al. | 439/71 |
| 6,210,176 B1 | 4/2001 | Hsiao | 439/71 |
| 6,217,348 B1 * | 4/2001 | Lin et al. | 439/83 |
| 6,257,899 B1 | 7/2001 | Walkup | 439/66 |
| 6,296,495 B1 | 10/2001 | Wang et al. | 439/71 |
| 6,375,474 B1 * | 4/2002 | Harper et al. | 439/66 |
| 2001/0049206 A1 | 12/2001 | Johnescu | 439/66 |

FOREIGN PATENT DOCUMENTS

| | | |
|---|---|---|
| DE | 3507646 C1 | 7/1986 |
| DE | 4344272 A1 | 6/1994 |
| EP | 0 009 314 A1 | 2/1980 |
| EP | 0 030 574 A1 | 6/1981 |
| EP | 0 849 842 A2 | 6/1998 |
| EP | 1 043 807 A2 | 10/2000 |
| EP | 1 076 382 A2 | 2/2001 |
| EP | 1 087 467 A2 | 3/2001 |
| EP | 1 043 807 A3 | 7/2001 |
| EP | 1 087 467 A3 | 1/2003 |
| JP | 4-101388 | 4/1992 |
| WO | WO-92/08258 | 5/1992 |
| WO | WO-94/11925 | 5/1994 |
| WO | WO-98/15989 | 4/1998 |
| WO | WO-98/52734 | 11/1998 |
| WO | WO-99/38229 | 7/1999 |

* cited by examiner

ELECTRICAL CONTACT ASSEMBLY WITH INSULATIVE CARRIER, STAPLED CONTACT ATTACHMENT AND FUSIBLE ELEMENT

BACKGROUND OF THE INVENTION

1. Field of the Invention

The present invention relates to an electrical connector and, more particularly, to an electrical connector with deflectable contacts and fusible elements.

2. Brief Description of Prior Developments

U.S. Pat. No. 6,193,523 discloses a contact for an electrical connector with a mounting portion for a solder ball. U.S. Pat. No. 6,217,348 discloses an electrical connector with an upwardly extending contact section and a solder ball. Various other patents disclose land grid array connectors which use solder balls and deflectable spring arms, such as U.S. Pat. Nos. 6,179,624 and 5,772,451 for example.

There is a continuing desire in the area of land grid array connectors to reduce the footprint size of the connectors, or increase contact density for a predetermined footprint size. Furthermore, the length of a spring feature in a contact in a land grid array connector still needs to be long enough and the spring powerful enough to provide certain predetermined contact force requirements. The contact also preferably provides a wiping feature when making contact with another electrical component.

Manufacturing of small electrical contacts by use of a forming operation can results in contacts being manufactured with inconsistent dimensions because of variations in thickness of the stock material. The problem due to stock material thickness can be multiplied in contacts which comprise multiple bends to be formed during the forming operation. This can result in the manufacture of contacts which do not meet predetermined specifications. This can be especially detrimental in small size contacts, such as contacts used in land grid array connectors having 800 or more contacts in a 1 mm×1 mm grid which are mounted in a housing which is only about 42 mm square.

There is a desire to provide a land grid array connector which can use ball grid array technology and which also comprises a greater density of electrical contacts than previously available. However, electrical contacts of the connector still need to provide sufficient contact force, contact wiping, and stability to be commercially marketable as a dependable product with a reasonably long working life. Such a connector also needs to be manufacturable at a reasonable, marketable cost in order to be commercially acceptable to customers.

SUMMARY OF THE INVENTION

In accordance with one aspect of the present invention, an electrical contact assembly is provided including a contact terminal and a fusible element. The contact terminal has a base and two cantilevered deflectable contact arms extending from at least one lateral side of the base. A first one of the contact arms extends in a downward direction and a second one of the contact arms extends in an upward direction. The fusible element is fixedly attached to an end of the first contact arm. The fusible element is adapted to be fused to a first pad on a first electronic component. The second contact arm comprises a surface contact area for contacting a second pad on a second electronic component. The first and second contact arms are adapted to deflect when the fusible element is fused to the first electronic component and when the contact area of the second contact arm is contacted by the second pad of the second electronic component.

In accordance with another aspect of the present invention, an electrical connector subassembly is provided comprising a carrier comprising electrically insulative material; and a plurality of electrical contact terminals connected to the carrier. Each terminal comprises a base and at least two deflectable contact arms extending from at least one lateral side of the base. The carrier comprises apertures. At least one of the contact arms of each terminal extends through a respective one of the apertures. The base of each terminal comprises tabs which are deformed to form a stapled connection of the base with the carrier.

In accordance with one method of the present invention, a method of assembling an electrical contact assembly is provided comprising steps of providing a contact terminal comprising a base and two cantilevered deflectable contact arms extending from a same lateral side of the base, a first one of the contact arms extending in an upward direction and a second one of the contact arms extending in a downward direction; and attaching a fusible element to an end of the second contact arm.

BRIEF DESCRIPTION OF THE DRAWINGS

The foregoing aspects and other features of the present invention are explained in the following description, taken in connection with the accompanying drawings, wherein.

DETAILED DESCRIPTION OF THE PREFERRED EMBODIMENTS

Figure 1:
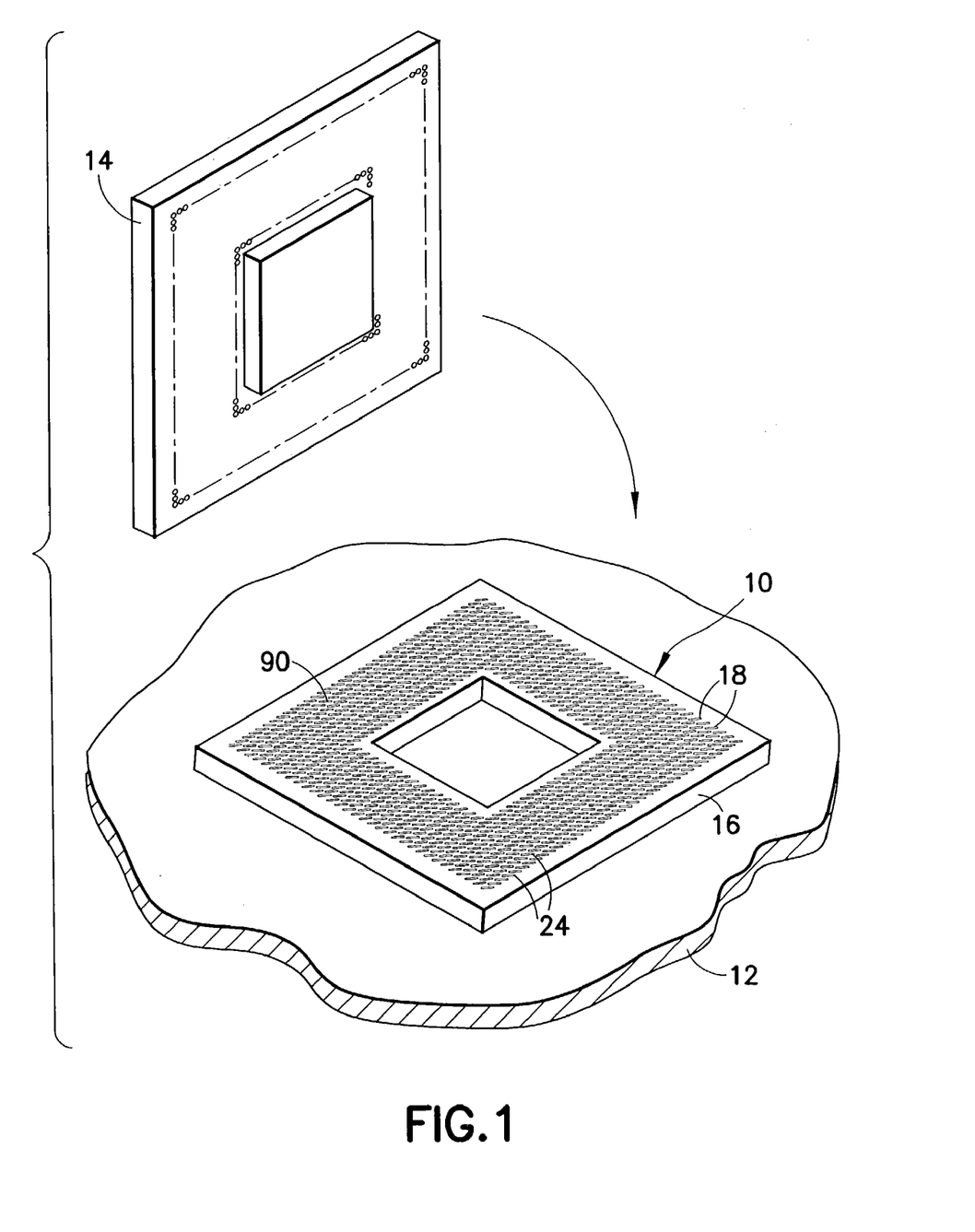
FIG. 1 is a exploded perspective review of an electrical connector incorporating features of the present invention shown attached to a portion of a printed circuit board and adapted to receive an electronic component.

Referring to FIG. 1, there is shown a perspective view of an electrical connector 10 incorporating features of the present invention shown attached to a first electronic component 12, such as a printed circuit board (PCB), and adapted to receive a second electronic component 14, such as a processor chip. The connector 10 is adapted to electrically attach the electronic component 14 to the printed circuit board 12. Although the present invention will be described with reference to the exemplary embodiments shown in the drawings, it should be understood that the present invention can be embodied in many alternate forms of embodiments. In addition, any suitable size, shape or type of elements or materials could be used.

The present invention can address the need for an electrical connection between two pads, such as in the case of connecting a land grid array (LGA) package to a pad on a PCB. The present invention can provide an optimized design to be configured into an array for high-density and high I/O counts. This optimized design can provide superior electrical performance from a short electrical path provided by the contact geometry. The short contact geometry also provides a low mated height.

The contact can consist of a spring having two spring beams, one formed up and the other formed down, and a carrier that provides a support for positioning the contacts. The contacts can be attached to the carrier by a feature on the contact, similar to a staple, that protrudes through the carrier and is then formed against the carrier to secure the contact to the carrier. One spring beam can have a solder ball attached to its tip. The spring beams can be designed to accommodate a torsional deflection and additional wipe of the upper beam contact created by the offset position of the spring beam relative to each other.

The contacts can be held in place by the contact staple feature attached to the insulating carrier with apertures in the carrier allowing the spring beams to protrude through one side of the carrier to make contact with the associated mating components when positioned and compressed. Assembly of multiple contacts allows for various array configurations determined by the mating component and assembly patterns. This design leads itself to rapidly producing multiple different contact configurations. A frame could be added to the carrier to provide mechanical stiffness to the contact pattern for ball grid array (BGA) placement and attachment.

Figure 2:
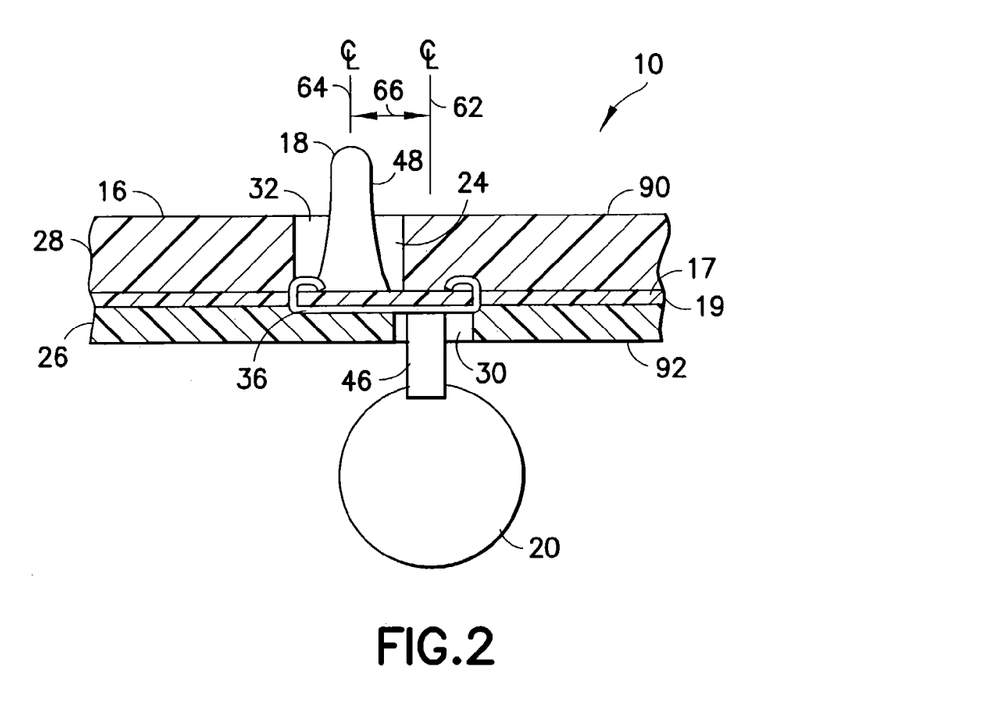
FIG. 2 is a partial cross sectional view of the electrical connector shown in FIG. 1.
Figure 3:
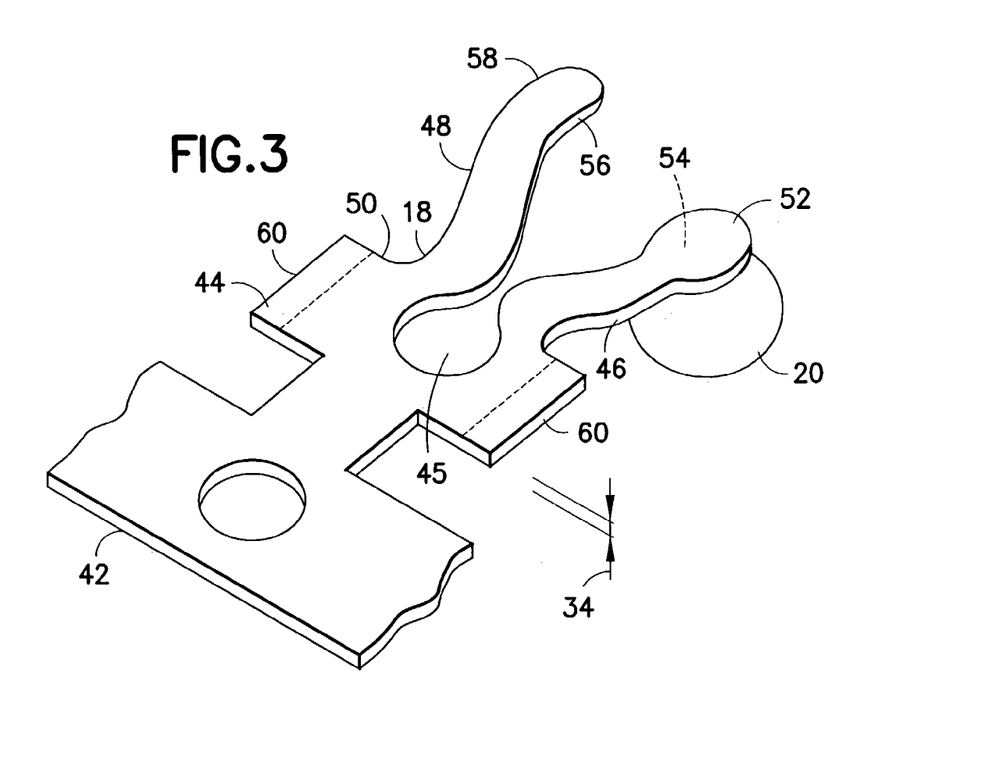
FIG. 3 is a perspective view of the contact and fusible element shown in FIG. 2 shown attached to a carry strip before attachment to the carrier.
Figure 4:
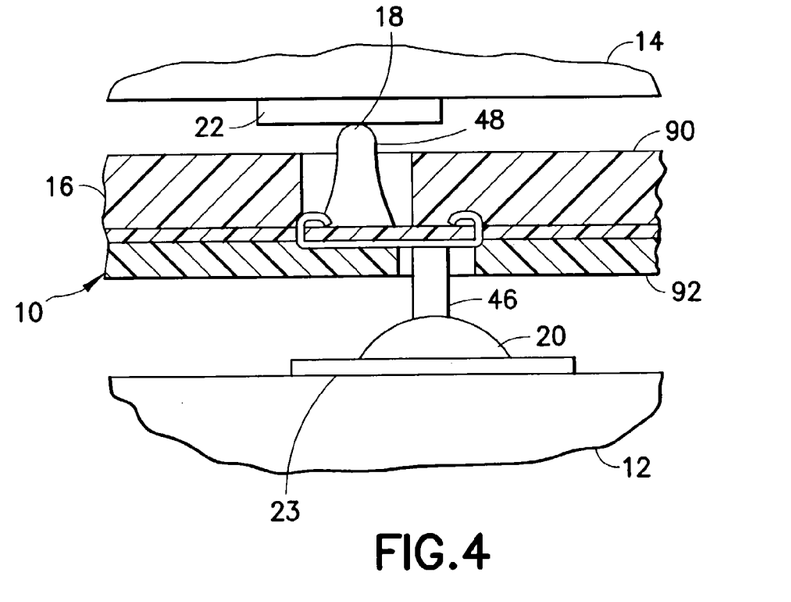
FIG. 4 is a partial cross sectional view of the electrical connector as shown in FIG. 2 shown attached to two electronic components.

Referring also to FIGS. 2 and 3, the electrical connector 10 comprises a housing 16 and at least one electrical connector subassembly 17. The electrical connector subassembly 17 generally comprises electrical contacts 18, a carrier 19, and fusible elements 20. FIG. 2 shows the electrical connector 10 before the electrical connector is attached to the PCB 12 and before the second electronic component 14 is attached to the connector. FIG. 4 shows the electrical connector 10 after the electronic component 14 is attached thereto by a compression means (not shown). The electrical connector 10 generally comprises a first side 90 which is adapted to function as a land grid array (LGA) connection and a second side 92 which is adapted to function as a ball grid array (BGA) connection.

The first electronic component 12, in the embodiment shown, comprises contact pads 23 on a top side thereof. In the embodiment shown, the contact pads 23 comprise solder pads. The contact pads 23 are adapted to have the fusible materials, such as solder balls 20, fused thereonto. The second electronic component 14, in the embodiment shown, comprises contact pads 22 on a bottom side thereof. The contact pads 22 are adapted to contact the electrical contacts 18 in a general land grid array type of connection.

As seen most clearly in FIGS. 2 and 4, portions of the electrical contacts 18 extend above and below the housing 16. The portions of the electrical contacts 18 can be deflected or moved towards the housing 16 by the second electronic component 14 when the second electronic component is attached to the electrical connector 10.

The housing 16 is comprised of electrically insulating material. In the embodiment shown, the housing 16 generally comprises a first member 26 and a second member 28. The first and second members 26, 28 form a plurality of electrical contact receiving areas 24. As seen in FIG. 1, the electrical contact receiving areas 24 are arranged in an array of parallel columns and parallel rows. In this embodiment, the array has a general square ring shape. However, in alternate embodiments, any suitable type of array could be provided.

The receiving areas 24 each comprise a first section 30, a second section 32 and a middle section 36. The first section 30 is located in the first member 26. The second section 32 is located in the second member 28. The middle section 36 is located in both the first and second members 26, 28 or may be located entirely within one of the members 26, 28. The middle section 36 is located at a junction between the first members 26, 28 and connects the first section 30 to the second section 32. The first and second sections 30, 32 are at least partially offset from each other as seen in FIG. 2.

Figure 5:
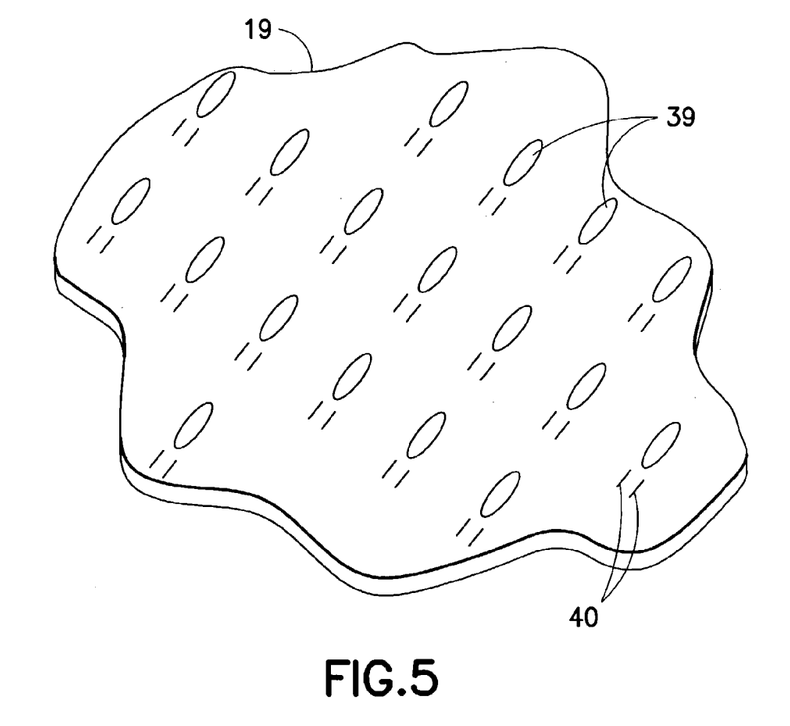
FIG. 5 is a partial perspective view of the carrier shown in FIG. 2.
Figure 6:
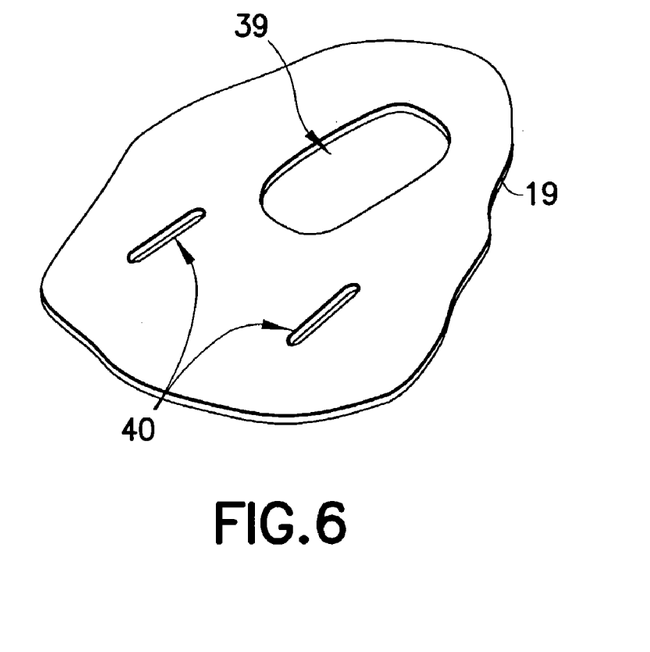
FIG. 6 is a partial enlarged perspective view of the carrier shown in FIG. 5.

The subassembly 17 is also located at the junction between the first and second members 26, 28. As noted above, the subassembly 17 generally comprises the electrical contacts 18, the carrier 19, and the fusible elements 20. Referring also to FIGS. 5 and 6, the carrier 19 preferably comprises a sheet of electrically insulative material. In this embodiment, the sheet 19 comprises a plurality of main apertures 38 and a plurality of staple slots 40. Each main aperture 38 comprises a pair of the staple slots 40 at one end thereof. The carrier 19 can be comprised of any suitable type of electrically insulative film material, such as KAPTON™. In a preferred embodiment, the carrier 19 is about 0.003–0.005 inches thick. The carrier 19 is preferably flexible. The carrier 19 adds stiffness to the contact 18.

Referring particularly to FIG. 3, one of the electrical contacts 18 is shown. The electrical contact 18 is shown still attached to its carry strip 42. The carry strip 42 would be removed before, during or after connection of the contact 18 to the carrier 19. In the embodiment shown, the electrical contacts 18 are substantially identical to each other. However, in alternate embodiments, the electrical connector 10 could comprise different types of electrical contacts. The electrical contact 18 is preferably comprised of flat sheet metal material, such as a copper alloy for example, which has been stamped and/or formed into the shape shown. The contact 18 can be plated with additional material, such as nickel and gold for example. In a preferred embodiment, the thickness or width 34 of the contact 18 is about 0.15 mm. However, in alternate embodiments, any suitable type of thickness or width could be provided.

The electrical contact 18 generally comprises a base 44 and two cantilevered, resiliently deflectable, contact arms 46, 48 extending from a same lateral side 50 of the base 44. The first contact arm 46 extends in a downward direction. The second contact arm 48 extends in an upward direction. An end 52 of the first contact arm 46 forms a fusible element attachment section. In the embodiment shown, the end 52 comprises a concave shaped bottom side 54 which forms a recess or pocket for receiving a portion of the solder ball 20. However, in an alternate embodiment, the recess in the bottom side 54 might not be provided and, the recess might not be preferred. An end 56 of the second contact arm 48 comprises a top surface 58 which forms a contact surface. In a preferred embodiment, the top surface 58 is stamped to form a curved surface. Preferably, the curved top surface 58 comprises a compound curvature. However, in alternate embodiments, the top surface 58 could comprise any suitable type of contact surface shape. The first contact arm 46 extends downward and the second contact arm 48 extends upward generally parallel to each other as shown by centerlines 62 and 64 in FIG. 2. The two centerlines 62, 64 are offset from each other.

The base 44 of the contact 18 includes an aperture 45 which is provided to increase the flexibility of the contact arms 46, 48 without increasing the length of the contact arms. However, the aperture 45 decreases the stiffness or rigidity of the base 44. By attaching the base 44 to the carrier 19, the carrier 19 is able to add stiffness to the base 44.

The base 44 also includes two cantilevered side tabs 60. The side tabs 60 are used as mounting means for attaching the contact 18 to the carrier 19. More particularly, the tabs 60 are deformed to extend through the staple slots 40 in the carrier 19 and back towards the main section of the base 44 as shown in FIG. 2 in a stapled mounting configuration. Thus, the base 44 captures a portion of the carrier 19 thereto by a staple mounting procedure. When the contact 18 is attached to the carrier 19 the second contact arm 48 is able to extend through one of the apertures 39. The apertures 39, thus, provide a clearance hole for the second contact arm 48. The slots 40 might not be provided before the staple mounts are attached, such as when the staple mounts pierce through the carrier 19. The staple mounts comprise the tabs 60 being bent towards each other and then inward towards the base 44 to capture portions of the carrier between outer ends of the tabs 60 and the base 44. In alternate embodiments, other forms of staple mounting could be provided. Alternatively or additionally, any other suitable form of attaching the contacts to the carrier could be provided.

The fusible elements 20, generally comprise solder balls. A top side of each solder ball 20 is fused to the concave bottom side 54 of the first contact arm 46, by reflow techniques using solder paste or solder flux. The fusible elements 20 are preferably attached to the contacts 18 before the contacts are attached to the carrier 19.

With the subassembly 17 assembled, the subassembly is then assembled with the housing 16. The subassembly 17 is located such that the carrier 19 is located at the junction between the first and second members 26, 28. The base 44 is also located at the junction between the first and second members 26, 28 in the middle section 36 of the contact receiving area 24. The first and second members 26, 28 can be fixedly attached to each other by any suitable means. In one type of embodiment, adhesive layers between the first and second members and the carrier 19 hold the elements of the housing together. In another type of embodiment, the members 19, 26, 28 could be ultrasonically welded to each other.

The first contact arm 46 extends from the middle section 36 through the first section 30 of the contact receiving area 24 and past the bottom of the housing 16. The first contact arm 46 is deflectably movable in the first section 30. The second contact arm 48 extends from the middle section 36 through the second section 32 of the contact receiving areas 24 and past the top of the housing 16. The second contact arm 48 is deflectably movable in the second section 32.

Referring particularly to FIG. 4, the electrical connector 10 would be attached to the first electronic component 12 before the second electronic component 14 is secured onto the component 12. When the connector 10 is attached to the first electronic component 12 the fusible element 20 is placed against the pad 23. The fusible element 20 is then melted, such as in a solder reflow heating process, to allow the fusible element 22 to fuse with the pad 23 and form a fixed stationery electrical and mechanical connection therebetween. The contact arms 46 of the many contacts 18 will deflect outward different amounts due to different sizes of the solder balls 20 before melting, such as due to tolerance variations of the solder balls, and different sizes and shapes of the contact arms 46 due to tolerance variations.

Once the electrical connector 10 is attached to the first electronic component 12, the second electronic component 14 can be removably connected to the connector 10. When the second electronic component 14 is attached to the connector 10, the contact pads 22 press against the contact surfaces 58 on the second contact arms 48. Because the centerline axis 64 of the second contact arm 48 is offset by a distance 66 from the center line axis 62 of the first contact arm 46, there is provided a torsional bending of at least the second contact arm 48, and perhaps the base 44 and/or first contact arm 46, during deflection by contact with the pads 22 against the contact surfaces 58. This torsional deflection provides an additional wipe of the contact surface 58 against the pads 22 to be created by the offset position of the spring beams 46, 48 relative to each other. The clamping structure which presses the second component 14 towards the first component 12 causes both the arms 46, 48 to deflect in generally opposite directions towards the base 44. This structure increases the height of available deflection by using area both above and below the base 44 and, increases the normal force against the pads 22 because of the use of both arms 46, 48 to deflect.

In an alternate embodiment, the staple slots 40 might not be provided in the carrier 19 before the contacts 18 are attached to the carrier. Instead, the staple slots could be formed during connection of the contacts 18 to the carrier 19. In an alternate embodiment, the carrier 19 could comprise any suitable thickness. The carrier 19 could be rigid or semi-rigid. In another alternate embodiment, the carrier could comprise a laminated structure with multiple layers, such as a layer of stainless steel laminated with an electrically insulative isolator, such as comprised of KAPTON™. In another alternate embodiment, any suitable type of method for attaching the contact to the carrier could be provided. Any suitable connection of the fusible element to one of the contact arms could be provided. Both of the contact arms could comprise fusible elements attached thereto, such as for a non-removable connection. The fusible elements could also be attached to the contacts after the contacts are attached to the carrier. In another alternate embodiment, the fusible elements 20 could be attached to the contacts 18 after the carrier 19 and contacts 18 are assembled with the housing 16.

Figure 7:
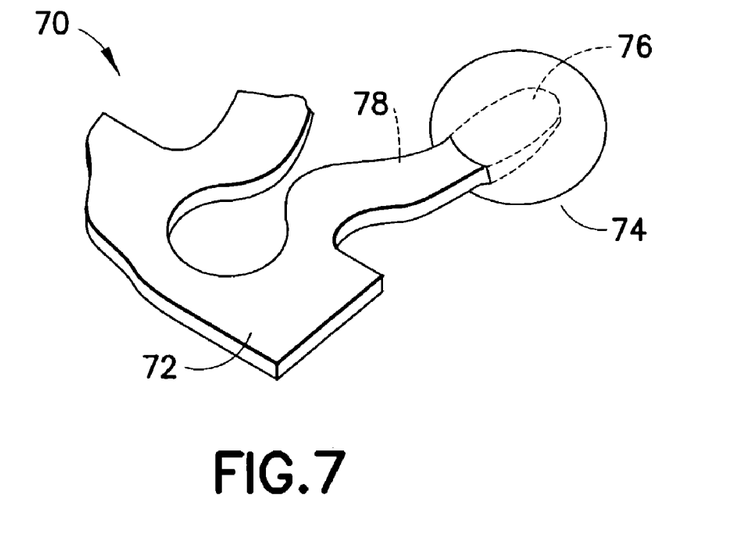
FIG. 7 is a partial perspective view similar to FIG. 3 of an alternate embodiment of the attachment of the fusible element to an electrical contact.

Referring now to FIG. 7, a partial perspective view of an alternate embodiment of the present invention is shown. In this embodiment the subassembly 70 generally comprises an electrical contact 72 and a fusible element 74. The electrical contact 72 is substantially identical to the electrical contact 18 shown in FIG. 3. However, the end 76 of the first contact arm 78 does not comprise an inverted bowl shape as the end 52 shown in FIG. 3. In this embodiment, the end 52 extends into the fusible element. The fusible element 74 is located on the end 76 with the end 76 being located inside the fusible element 74. Thus, this embodiment illustrates that the fusible element 74 can be fused to the end 76 before attachment of the fusible element 74 to the contact pad on the printed circuit board. The subassembly 70 can be subsequently attached to a carrier, such as the carrier 19.

The present invention can provide a BGA to LGA or compressive beam connection that has an array with a high contact density, low inductance, high speed, and low cost manufacture. Because of the small size of the contacts, the use of the carrier helps to eliminate contact positioning problems in the housing during connector assembly. The use of the carrier in the present invention also helps to eliminate the small contact transporting problems found in assembly of conventional connectors having small contacts. The present invention provides greater manufacturing configuration flexibility by allowing the contacts to be connected to the carrier in any selected type of array design while still using the same contacts and carrier. The small height of the contacts help to reduce the height of the connector. The contact design also helps to reduce induction and impedance. Torsional bending can be provided to enhance contact wipe.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. An electrical contact assembly comprising:
a contact terminal comprising a base and two cantilevered deflectable contact arms extending from at least one lateral side of the base, a first one of the contact arms extending in a downward direction and a second one of the contact arms extending in an upward direction; and
a fusible element fixedly attached to an end of the first contact arm,
wherein the fusible element is adapted to be fused to a first pad on a first electronic component, wherein the second contact arm comprises a surface contact area for contacting a second pad on a second electronic component, and wherein the first and second contact arms are adapted to deflect when the contact area of the second contact arm is contacted by the second pad of the second electronic component.

2. An electrical contact assembly as in claim 1 wherein the contact terminal comprises stamped sheet metal.

3. An electrical contact assembly as in claim 1 wherein the surface contact area on the second contact arm comprises a compound curvature.

4. An electrical contact assembly as in claim 1 wherein the end of the first contact arm comprises a concave bottom surface, and wherein a top surface of the fusible element is attached to the end of the first contact arm against the bottom concave surface.

5. An electrical contact assembly as in claim 1 wherein a top surface of the fusible element is attached to a bottom surface of the end of the first contact arm.

6. An electrical contact assembly as in claim 1 wherein the end of the first contact arm extends into the fusible element.

7. An electrical contact assembly as in claim 1 wherein the first and second contact arms extend from a same lateral side of the base.

8. An electrical contact assembly as in claim 7 wherein the first and second contact arms extend in opposite directions generally parallel to each other.

9. An electrical connector subassembly comprising:
a carrier comprising electrically insulative material;
an electrical contact assembly as in claim 1 connected to the carrier,
wherein the carrier comprises an aperture, wherein at least a portion of one of the contact arms extends through the aperture, and wherein the base comprises tabs which extend through the carrier and are deformed with the tabs extending back towards a main section of the base to form a stapled connection of the base with the carrier.

10. An electrical connector subassembly as in claim 9 wherein the carrier comprises a sheet of electrically insulative material, wherein the sheet comprises a plurality of the apertures, and wherein the subassembly comprises a plurality of the electrical contacts connected to the sheet in an array of multiple rows and columns.

11. An electrical connector subassembly as in claim 9 wherein the carrier comprises a film having a general sheet shape.

12. An electrical connector subassembly as in claim 11 wherein the film is flexible.

13. An electrical connector subassembly comprising:
a carrier comprising electrically insulative material; and
a plurality of electrical contact terminals connected to the carrier, each terminal comprising a base and at least two deflectable contact arms extending from at least one lateral side of the base,
wherein the carrier comprises apertures, wherein at least one of the contact arms of each terminal extends through a respective one of the apertures, and wherein the base of each terminal comprises tabs which extend through the carrier and are deformed with the tabs extending back towards a main section of the base to form a stapled connection of the base with the carrier, and
further comprising a fusible element fixedly attached to an end of a first one of the contact arms, wherein the end of the first contact arm comprises a concave bottom surface, and wherein a top surface of the fusible element is attached to the end of the first contact arm against the bottom concave surface.

14. An electrical connector subassembly as in claim 13 wherein the contact terminals comprise stamped sheet metal.

15. An electrical connector subassembly as in claim 13 wherein a first one of the contact arms extending in a downward direction and a second one of the contact arms extending in an upward direction, and wherein a surface contact area on the second contact arm comprises a compound curvature.

16. An electrical connector subassembly as in claim 13 wherein the contact arms extend from a same lateral side of the base.

17. An electrical connector subassembly as in claim 16 wherein the contact arms extend in opposite directions generally parallel to each other.

18. An electrical connector subassembly comprising:
a carrier comprising electrically insulative material; and
a plurality of electrical contact terminals connected to the carrier, each terminal comprising a base and at least two deflectable contact arms extending from at least one lateral side of the base,
wherein the carrier comprises apertures, wherein at least one of the contact arms of each terminal extends through a respective one of the apertures, and wherein the base of each terminal comprises tabs which extend through the carrier and are deformed with the tabs extending back towards a main section of the base to form a stapled connection of the base with the carrier, and
further comprising a fusible element fixedly attached to an end of a first one of the contact arms, wherein a top surface of the fusible element is attached to a bottom surface of the end of the first contact arm.

19. An electrical connector subassembly comprising:
a carrier comprising electrically insulative material; and
a plurality of electrical contact terminals connected to the carrier, each terminal comprising a base and at least two deflectable contact arms extending from at least one lateral side of the base,
wherein the carrier comprises apertures, wherein at least one of the contact arms of each terminal extends through a respective one of the apertures, and wherein the base of each terminal comprises tabs which extend through the carrier and are deformed with the tabs extending back towards a main section of the base to form a stapled connection of the base with the carrier, and further comprising a fusible element fixedly attached to an end of a first one of the contact arms, wherein the end of the first contact arm extends into the fusible element.

20. A method of assembling an electrical contact assembly comprising steps of:

providing a contact terminal comprising a base and two cantilevered deflectable contact arms extending from a same lateral side of the base, a first one of the contact arms extending in an upward direction and a second one of the contact arms extending in a downward direction; and attaching a fusible element to an end of the second contact arm, wherein the first and second contact arms are adapted to deflect in opposite directions towards the base when the contact assembly is compressed between two electronic components.

21. A method as in claim 20 further comprising attaching the base of the contact terminal and to a carrier comprised of insulative material, the step of attaching comprising extending tabs on the base through the carrier and deforming the tabs back towards a main section of the base to form a stapled connection of the base to the carrier.

* * * * *